US010795783B2

(12) United States Patent
Wojewoda et al.

(10) Patent No.: US 10,795,783 B2
(45) Date of Patent: Oct. 6, 2020

(54) FAULT TOLERANT CLOCK MONITOR SYSTEM

(71) Applicant: Microchip Technology Incorporated, Chandler, AZ (US)

(72) Inventors: Igor Wojewoda, Tempe, AZ (US); Bryan Kris, Gilbert, AZ (US); Stephen Bowling, Chandler, AZ (US); Yong Yuenyongsgool, Gilbert, AZ (US)

(73) Assignee: MICROCHIP TECHNOLOGY INCORPORATED, Chandler, AZ (US)

( * ) Notice: Subject to any disclaimer, the term of this patent is extended or adjusted under 35 U.S.C. 154(b) by 181 days.

(21) Appl. No.: 16/158,471

(22) Filed: Oct. 12, 2018

(65) Prior Publication Data
US 2019/0114235 A1  Apr. 18, 2019

Related U.S. Application Data

(60) Provisional application No. 62/572,792, filed on Oct. 16, 2017.

(51) Int. Cl.
*G06F 11/00* (2006.01)
*G06F 11/16* (2006.01)
*G06F 11/14* (2006.01)
*H03K 5/19* (2006.01)

(52) U.S. Cl.
CPC ........ *G06F 11/1604* (2013.01); *G06F 11/142* (2013.01); *G06F 11/1679* (2013.01); *H03K 5/19* (2013.01)

(58) Field of Classification Search
CPC . G06F 11/142; G06F 11/1604; G06F 11/1679
See application file for complete search history.

(56) References Cited

U.S. PATENT DOCUMENTS

| 5,404,363 | A  | * | 4/1995 | Krause | ...................... G06F 1/12 |
| | | | | | 714/814 |
| 6,349,391 | B1 | * | 2/2002 | Petivan | ................. G06F 11/165 |
| | | | | | 712/10 |
| 7,242,223 | B1 | | 7/2007 | Alon | .............................. 327/39 |
| 2016/0065215 | A1 | | 3/2016 | Shin et al. | ....................... 327/45 |
| 2016/0301416 | A1 | * | 10/2016 | Milijevic | .................. H03L 7/07 |
| 2016/0359476 | A1 | | 12/2016 | Yu et al. | ........................ 327/115 |

OTHER PUBLICATIONS

International Search Report and Written Opinion, Application No. PCT/US2018/055564, 13 pages, dated Jan. 7, 2019.

* cited by examiner

*Primary Examiner* — Michael Maskulinski
(74) *Attorney, Agent, or Firm* — Slayden Grubert Beard PLLC (57) ABSTRACT

A clock monitor includes a test clock input, as a reference clock input, another clock input, a measurement circuit, and control logic. The measurement circuit generates a measurement of a frequency or a duty cycle of the test clock input using the reference clock input, which is compared to a threshold. The control logic determines whether the measurement exceeded the threshold and, based on the measurement exceeding the threshold, cause generation of another measurement of a frequency or a duty cycle using the third clock input in combination with the first clock input or the reference clock input. The control logic may determine whether the other measurement exceeded a threshold and, based on such a determination, further determine that the test clock input or the reference clock input are faulty.

20 Claims, 4 Drawing Sheets

FAULT TOLERANT CLOCK MONITOR SYSTEM

RELATED APPLICATION

This application claims priority to U.S. Provisional Patent Application No. 62/572,792 filed Oct. 16, 2017, the contents of which are hereby incorporated in their entirety.

FIELD OF THE INVENTION

The present disclosure relates to oscillators and timing circuits for integrated devices and, more particularly, to a fault tolerant clock monitor system.

BACKGROUND

A fail-safe clock monitor (FSCM) may be included in various systems for monitoring whether an oscillator or a clock has failed. Oscillators may include oscillators internal or external to a chip, die, processor, or other electronic device. Internal oscillators may be R—C based and therefore have wide tolerances and low temperature stability. External oscillators may be circuit-based, quartz-based, or crystal-based, and a signal from the oscillator may be routed to an external pin of the electronic device. External oscillators may be more reliable, stable, and precise sources of clock frequency, but may be subject to assembly errors and printed circuit board damage.

Oscillators may experience various faults. For example, an oscillator may fail to start up, may fail to lock into phase, or may experience a power failure. A connection from the oscillator to its intended targets may fail and thus the oscillator may merely appear to fail. Load capacitance may cause faults. Each quartz crystal may be designed for a specific load capacitance. Capacitors may be used between a pin of the quartz crystal and ground. During oscillation, electric charge flows from a capacitor through the quartz and into another and back again. The attached capacitors may need to match the crystal's internal capacitance for a stable and precise oscillation. Given a specific load capacitance identified by designers of the oscillators, the crystal may oscillate with the specified frequency. If the load is too low, the crystal might not start oscillating, as there is insufficient electric charge to oscillate between the capacitors and the crystals. If the load is too high, the voltage swing of the oscillation may be reduced because of the additional charge in the capacitors that cannot flow through the crystal. A pin can form a parasitic capacitance, which can increase if sockets are used. The copper lines or leads of a printed circuit board can add parasitic capacitance. These capacitances might need to be subtracted from the load capacitors' values to match the required load. If parasitic capacitance increases or decreases, performance of the crystal may suffer.

SUMMARY

A clock monitor may include a first clock input, configured as a test clock input. The clock monitor may include a second clock input, configured as a reference clock input. The clock monitor may include a third clock input. The clock monitor may include a measurement circuit configured to generate a first measurement of a frequency or a duty cycle of the test clock input using the reference clock input. The clock monitor may include a comparator circuit configured to compare the first measurement to one or more thresholds. The clock monitor may include control logic configured to determine whether the first measurement was below a lower limit or above an upper limit of one or more thresholds, based on a determination that the first measurement was below a lower limit or above an upper limit of one or more thresholds, cause the measurement circuit to generate a second measurement of a frequency or a duty cycle using the third clock input in combination with the test clock input or the reference clock input. The control logic may be configured to determine whether the second measurement was below a lower limit or above an upper limit of one or more thresholds. The control logic may be configured to, based on whether the second measurement was below a lower limit or above an upper limit of one or more thresholds, determine that the test clock input or the reference clock input are faulty. In combination with any of the above embodiments, the control logic may be further configured to select a backup clock to replace a clock source of the test clock input or the reference clock input based on the second measurement. In combination with any of the above embodiments, the control logic may be further configured to delay selection of a backup clock to replace a clock source of the test clock input or the reference clock input based on the first measurement. In combination with any of the above embodiments, the thresholds may include a first threshold, beyond which the control logic is configured to issue a warning signal while maintaining a clock source of the test clock input or the reference clock input. In combination with any of the above embodiments, the thresholds may include a second threshold, beyond which the control logic is configured to issue a failure while selecting a backup clock to replace the clock source of the test clock input or the reference clock input. In combination with any of the above embodiments, warning signal may include an interrupt event for a processor and the failure includes a clock switch event configured to replace the clock source. In combination with any of the above embodiments, the clock monitor may further include a backup clock select input to determine a backup clock from a plurality of clock candidates to replace a clock source of the test clock input or the reference clock input based on the second measurement. In combination with any of the above embodiments, the control logic may be further configured to adjust a period of time during which data is collected for measured clock inputs. In combination with any of the above embodiments, the control logic may be further configured to adjust accuracy for which data is collected for measured clock inputs. In combination with any of the above embodiments, the control logic may be further configured to cause the measurement circuit to generate the second measurement of a frequency or a duty cycle of the test clock input using the third clock input as a reference clock signal. In combination with any of the above embodiments, the control logic may be further configured to cause the measurement circuit to generate the second measurement of a frequency or a duty cycle of reference clock input using the third clock input as a reference clock. In combination with any of the above embodiments, the control logic may be further configured to select the test clock input and the reference clock input from three or more candidate clock signals.

Embodiments of the present disclosure may include an oscillator circuit, microcontroller, processor, system on a chip (SoC), appliance, consumer electronics device, or system including any of the clock monitors of the above embodiments.

Embodiments of the present disclosure may include methods performed by any of the clock monitors, oscillator circuits, microcontrollers, processors, SoCs, appliances, consumer electronics devices, or systems of the above embodiments.

DETAILED DESCRIPTION

Figure 1:
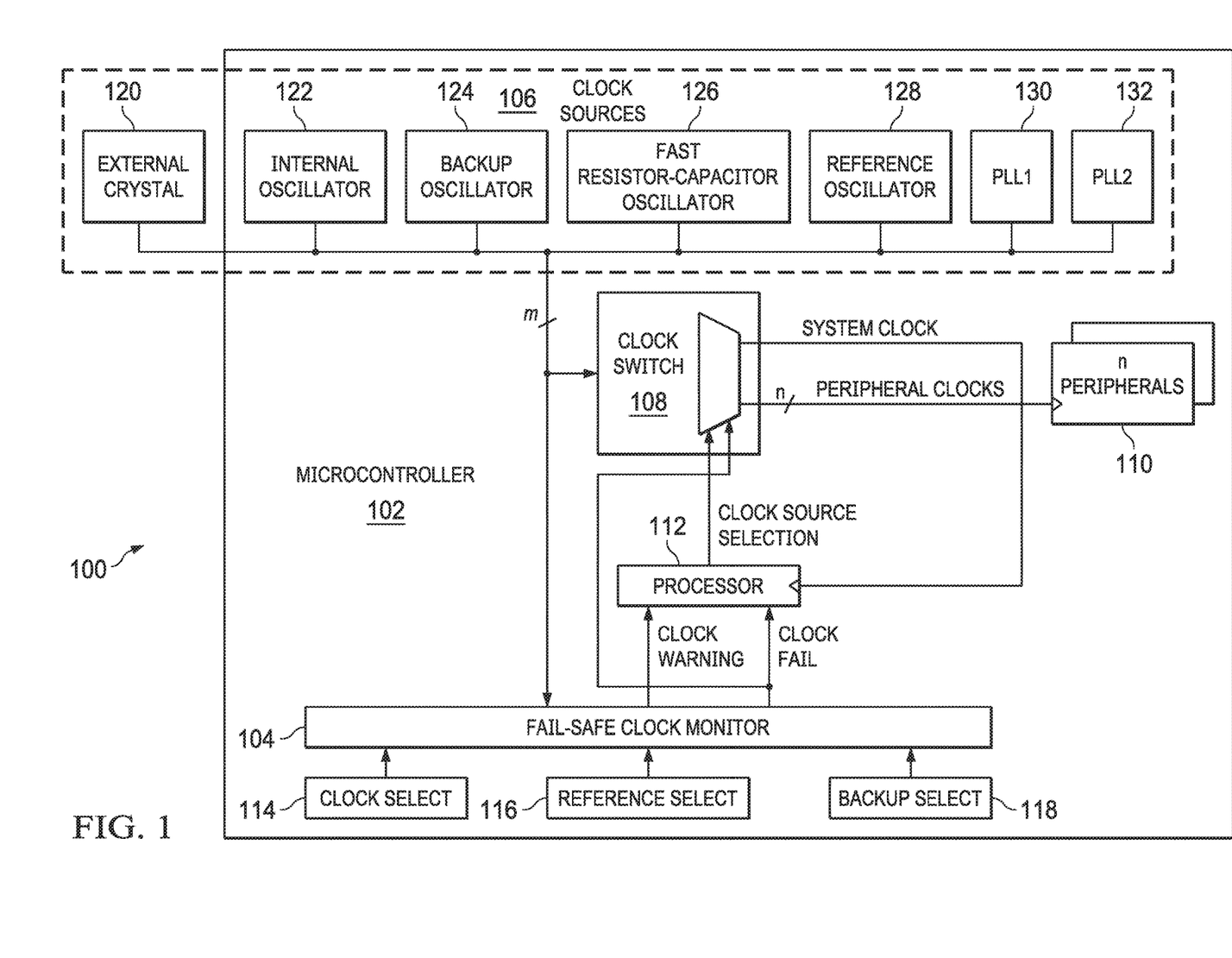
FIG. 1 illustrates an example fault tolerant clock monitor system, according to embodiments of the present disclosure.

FIG. 1 illustrates an example fault tolerant clock monitor system 100, according to embodiments of the present disclosure. System 100 may be configured to validate clocks, oscillators, or other clock sources. System 100 may be configured to evaluate the accuracy of clock sources and dynamically switch to alternate clock sources. Evaluation of a clock source may require use of another reference clock signal to verify the clock source. However, if the clock source fails the verification, it may be unknown whether the clock source was actually faulty or the reference clock signal was faulty. In one embodiment, upon an initial determination system that a clock signal is faulty, system 100 may be configured to cross reference different reference clock signals or clock sources to determine whether the original clock signal was faulty or whether the reference clock signal was faulty. In another embodiment, system 100 may be configured to determine whether a clock source is faulty necessitating a change in clock sources or other corrective action, or is faulty but only needing warning.

System 100 may include a FSCM 104. FSCM 104 may be configured to monitor clock performance in or on behalf of any suitable application, such as a microcontroller, system on a chip, integrated circuit device, appliance, consumer device, motor control, tool, vehicle, ignitor, automotive control, industrial control, power supply, or any other suitable electronic device. In the example of FIG. 1, FSCM 104 may monitor clock performance through implementation in a microcontroller 102. Microcontroller 102 may be implemented in any suitable manner. Microcontroller 102 may include a processor 112 and other components such as peripherals 110. Peripherals 110 may include bus communication modules, input and output, memory, memory access or interface modules, timers, event counters, serial ports, I2C, serial peripheral interface circuits, controller area network controllers, power converters, pulsed width modulation circuits, clock generators, general purpose input and output, or other suitable components. Peripherals 110 may be integrated within microcontroller 102. Processor 112 and peripherals 112 may each rely upon the same or different system clocks. Other elements of system 100 or microcontroller 102 that require a clock input may be referenced within the context of peripherals 110, even though such elements might not be otherwise defined as peripherals. There may be n different peripherals 110.

FSCM 104 may be configured to monitor any suitable clock. Clocks to be monitored by system 100 and FSCM 104 may include clock sources 106. Clock sources 106 may include, for example, an external crystal 120, an internal oscillator 122, a backup oscillator 124, a fast resistor-capacitor oscillator (FRC) 126, a reference oscillator 128, a first phase locked loop (PLL) (PLL1) 130, or a second phase locked loop (PLL2) 132. Some of clock sources 106 may be internal to system 100 or microcontroller 102, such as internal oscillator 122 or FRC 126. Some of clock sources 106 may be external to microcontroller 102, such as external crystal 120. Such a clock source may be routed to the interior of microcontroller 102 through an input pin. Some of clock sources 106 may be internal or external to microcontroller 102, depending upon the implementation thereof, such as reference oscillator 128 or backup oscillator 124. Clock sources 106 may be implemented in any suitable manner to generate a periodic clock signal. Each clock source may be configurable or static with regards to the frequency and duty cycle of its clock signal output. There may be m possible clock sources in clock sources 106.

Microcontroller 102 may include a clock switch 108 configured to route particular ones of clock sources 106 to processor 112 and peripherals 110. For example, clock switch 108 may be configured to select one of clock sources 106 as a system clock and route the system clock to processor 112 or other elements. Furthermore, clock switch 108 may be configured to particular other ones of clock sources 106 or the same system clock to particular ones of peripherals 110. The same clock signal may be sent to one or more elements of microcontroller 102. In some cases, a dedicated clock signal may be sent to a particular element of microcontroller 102. Some elements of microcontroller 102 may receive the same original clock signal but divide such a clock signal to match an expected or needed value. Clock switch 108 may be implemented by analog circuitry, digital circuitry, or any suitable combination thereof. For example, clock switch 108 may be implemented by a switch fabric or a series of multiplexers.

In one embodiment, selection of routing to be performed by clock switch 108 may be controlled by processor 112. In another embodiment, selection of routing to be performed by clock switch 108 may be controlled by FSCM 104. FSCM 104 may be able to change routing to be performed by clock switch 108 particularly when a clock signal to processor 104 is faulty. Thus, even if processor 104 fails due to a faulty clock signal, system 100 may be robust and able to recover because of the operation of FSCM 104. FSCM 104 may be given override authority with respect to processor 104 for changing switching operation of clock switch 108. Processor 112 or FSCM 104 may be configured to switch one or more of system clock or peripheral clocks to other clocks or backup clocks from clock sources 106 upon a detection that a given clock signal is faulty.

FSCM 104 may be implemented in any suitable manner, such as a suitable combination of analog or digital circuitry. More detailed implementation of FSCM 104 is shown below within the context of FIG. 2.

In one embodiment, FSCM 104 may be configured to select a clock signal from clock sources 106 to evaluate. In a further embodiment, FSCM 104 may be configured to select a reference signal from clock sources 106 with which to evaluate the selected clock signal. The reference signal may be used as a reference clock signal to synchronize the operation of timers, counters, and other circuitry within FSCM 104. The reference signal might need to be sufficiently faster than the clock signal to be evaluated such that a statistically significant number of samples may be taken for an accurate measurement. The reference signal and the clock signal to be evaluated may each be divided, if necessary, in terms of frequency so that an appropriate measurement may be made. FSCM 104 may be configured to measure the selected clock signal in any suitable manner.

For example, FSCM 104 may measure the duty cycle or the frequency of the selected clock signal.

For example, FSCM 104 may use reference oscillator 128 as a reference or source clock signal for its own operation. Reference oscillator 128 might be implemented as a 31.25 KHz low power resistor-capacitor (LPRC) oscillator. FSCM 104 may detect the selected clock signal to be evaluated (such as external crystal 120) for a detection period of p periods, such as 63 periods. Thus, for a length of time of (63/31250), FSCM 104 may count a number of received pulses from external crystal 120. FSCM 104 may be configured to detect rising edges or falling edges to identify pulses. The number of received pulses may be stored in a counter. The time for detection may be set by a countdown timer set to the number of pulses to be received from the reference clock. FSCM 104 may calculate a frequency of the signal under test based on the number of pulses, or may use the number of pulses as a proxy measurement for frequency of the signals. Similarly, a duration between a number of received pulses may counted with a counter. Such a duration of time, measured in pulses of the reference signal, between received pulses of the signal under test may represent a duty cycle of the signal under test. Such a number of pulses may be used to calculate the duty cycle or used as proxy measurement for the duty cycle.

FSCM 104 may store or have access to a number of expected pulses, or of the duty cycle or frequency. Each of clock sources 106 may have a corresponding expected duty cycle or frequency. If an insufficient number of pulses have been received, or if too many pulses have been received, FSCM 104 may take corrective action. Such corrective action may depend upon the number of pulses received. In one embodiment, FSCM 104 may issue a clock warning. The clock warning may be sent to processor 112. The clock warning may identify the faulty clock signal. The clock warning may identify a degree to which the clock signal is faulty. Processor 112 may take further corrective action, if necessary. A clock warning may be issued when the number of pulses that are received does not conform to an expected number of pulses, but does not yet represent a catastrophic failure. The clock warning may be used to warn a user of system 100, or to take further investigative steps or diagnostics. The clock warning may be implemented by, for example, an interrupt, register value, or bus signal.

In another embodiment, FSCM 104 may issue a clock fail signal. The clock fail signal may be implemented by, for example, an interrupt, register value, event, or bus signal. The clock fail signal may be sent to processor 112. Furthermore, the clock fail signal may be used to directly change switching of clock switch 108. The clock fail signal may indicate that the faulty clock signal will cause portions of system 100 to work incorrectly. A clock fail signal for a faulty clock used to power, for example, a peripheral, might be handled by processor 112. Processor 112 may issue a change in clock source selection for the faulty clock in clock switch 108. However, if the system clock is the identified faulty clock, FSCM 104 may directly change the selection of the system clock in clock switch 108. Thus, processor 112 or FSCM 104 may select backup clocks for faulty clocks as corrective action.

FSCM 104 may be configured to choose which of clock sources 106 to test through clock select 114. FSCM 104 may be configured to choose which of clock sources 106 to use as a reference clock through reference select 116. FSCM 104 may be configured to choose a backup clock to use in case of a faulty clock through backup select 118. Backup select 118 may include a designation or a hierarchy of designations of backup clocks for each of clock sources 106.

Each of clock select 114, reference select 116, and backup select 118 may be set in any suitable manner. For example, each of clock select 114, reference select 116, and backup select 118 may be set by register values by software or a user of system 100, enable signals of a diagnostic module or circuit of system 100, by processor 112, or by FSCM 104 itself during a diagnostic routine. Accordingly, FSCM 104 may be configured to test any of clock sources 106 using any one of the other of clock sources 106 as the reference signal. FSCM 104

Moreover, FSCM 104 may be configured to test a given clock signal for a configurable duration of time. For example, the number of expected clock signal periods or the total counter time for frequency measurement may be configured though registers, user input, or built-in logic. While measurements may be more accurate if more time is taken to measure the signal, such time may otherwise detract from performance. Thus, more time may be given for testing of critical clock sources, or if system 100 is not operating in a time-critical matter. In other cases, less time may be given for testing of clock sources. The trade-off between measurement accuracy and speed may be configurable for system 100.

In addition, FSCM 104 may be configured to test a given clock signal at any suitable time or any suitable basis. FSCM 104 may be configured to test ones of clock sources 106 more often or less often compared to others of clock sources 106. The testing of a given one of clock source 106 may be configurable through setting of a register, or made on-demand by processor 112 or other elements upon recognition of another event or condition. The testing of clock sources 106 may be performed, for example, on start-up, soft boot, or restart of microcontroller 102. Furthermore, the testing of a given one of clock source 106 may be performed upon activation of a related element of system 100. For example, upon startup of a motor that is to use PWM signals generated by PLL1 130, PLL1 130 may be tested. Specific ones of clock sources 104 may be tested periodically. For example, external crystal 120 may be tested every second while reference oscillator 128 is tested every ten seconds.

In one embodiment, FSCM 104 may be configured to perform a multiple-stage cross-check of a given one of clock sources 106 when a preliminary determination is made that the given clock source is faulty. As discussed above, testing a clock signal requires use of a reference clock signal to time circuitry for counting pulses and other tasks. Determining that the tested clock signal is inaccurate may be an incorrect determination if the reference signal is itself faulty. Accordingly, upon an initial determination that the clock signal under test is faulty, a second test may be performed. In one embodiment, the second test may be performed to retest the original clock signal under test with a different, second reference signal. If the second test still shows that the original clock signal under test is faulty, FSCM 104 may be configured to determine that the original clock signal under test is faulty and perform corrective action. If the second test still shows that the original clock signal under test is faulty, FSCM 104 may be configured to determine that the original reference signal was faulty and take corrective action. FSCM 104 may be configured to directly test the original reference signal using yet another reference signal or the second reference signal, and then determine that the original reference signal was faulty and take corrective action. In another embodiment, the second test may be performed to test the original reference signal with another reference signal. If the original reference signal is determined to be faulty in the second test, FSCM 104 may take corrective action on the original reference signal. If the original reference signal is not determined to be faulty in the second test, FSCM 104 may take corrective action on the original signal under test.

Figure 2:
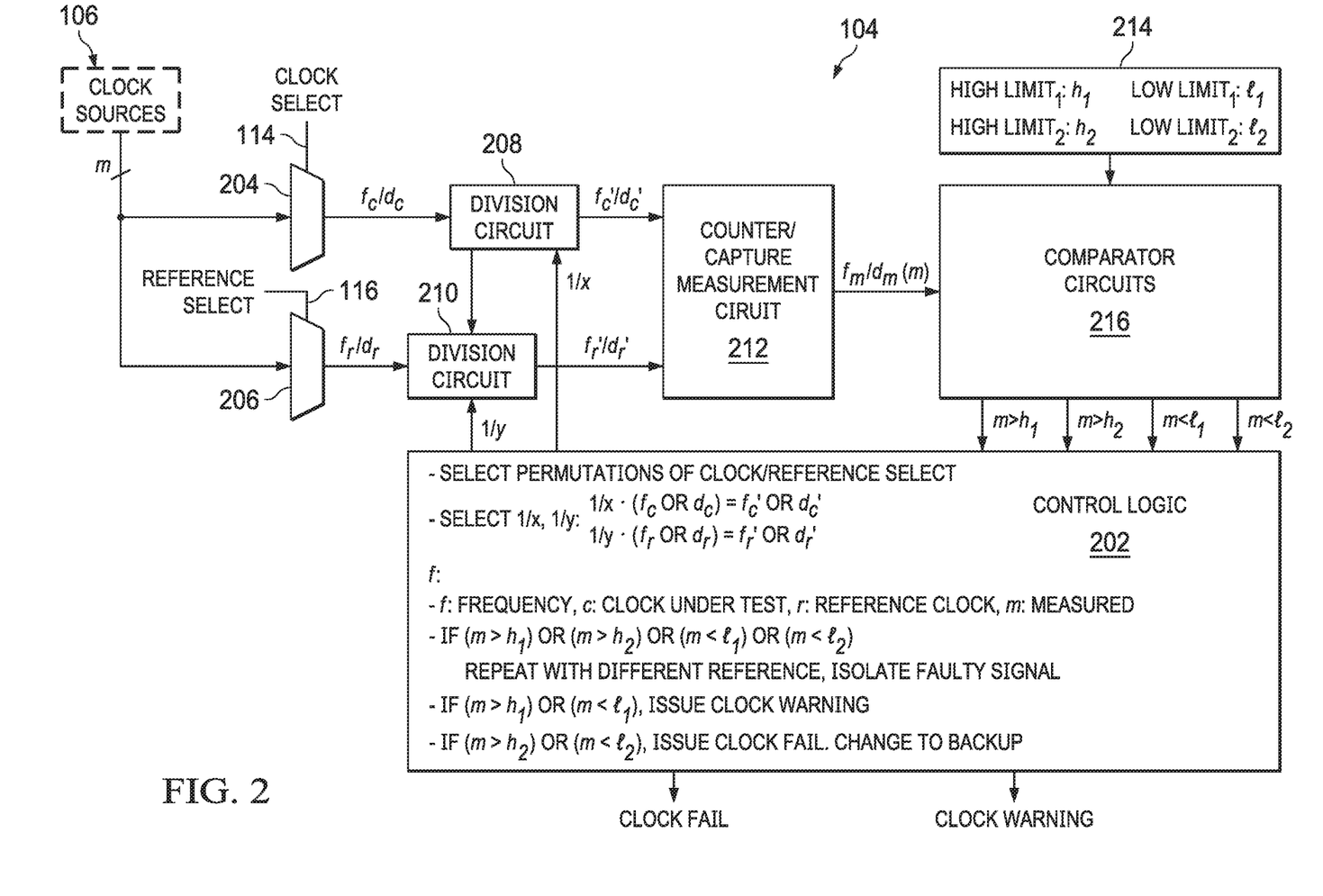
FIG. 2 is a more detailed illustration an example fault tolerant clock monitor system, according to embodiments of the present disclosure.

FIG. 2 is a more detailed illustration of F SCM 104, according to embodiments of the present disclosure. Some operations and control flow of FSCM 104 may be set by control logic 202, which may be implemented by any suitable combination of digital logic and circuitry.

Control logic 202 may be configured to determine which of clock sources 106 is to be tested. Control logic 202 may make such a determination through clock select 114, or by determining a diagnostic routine, register value, or control signal, and setting clock select 114. Control logic 202 may be configured to determine which of clock sources 106 is to be used as a reference signal. Control logic 202 may make such a determination through reference select 116, or by determining a diagnostic routine, register value, or control signal, and reference select 116. The selected clock signal under test may be referenced as c, and may have a frequency $f_c$ or a duty cycle $d_c$. The selected reference signal may be in turn designated as r, and may have a frequency $f_r$ or a duty cycle $d_r$.

FSCM 104 may include a division circuit 208 configured to divide the frequency or duty cycle of the clock signal under test c. This may yield a resultant signal with a modified frequency $f_c'$ or a duty cycle $d_c'$. Division circuit 208 may apply a divider factor of (1/x). FSCM 104 may include a division circuit 210 configured to divide the frequency or duty cycle of the reference clock signal r. This may yield a resultant signal with a modified frequency $f_r'$ or a duty cycle $d_r'$. Division circuit 210 may apply a divider factor of (1/y). Division circuits 208, 210 may be implemented by frequency divider or duty cycle divider circuits that are independently configurable as the degree to which the frequency or duty cycle may be divided. The dividing factors x and y for division circuits 208, 210 may be set by, for example, control logic 202. The dividing factors x and y may be set according to the identity and expected frequency or duty cycle of the selected clock under test and reference clock from clock sources 106. The dividing factors x and y may be selected such that the reference clock signal may be appropriately used to run timing mechanisms to measure the clock signal under test. Thus, the particular values of x and y may depend upon the particular combination of clock sources 106 in use. Various appropriate values for x and y may be stored for different combinations of clock sources 106 in registers, tables, or other suitable locations, or may be calculated based upon the expected frequency of the selected clock sources 106. The dividing factors x and y may be selected or calculated to sufficiently satisfy Nyquist's Theorem or other technical requirements.

The resulting signals from division circuits 208, 210 may be passed to a measurement circuit 212. Measurement circuit 212 may be implemented with any suitable sampling, capturing, sample-and-hold, or other circuits. Measurement circuit 212 may be implemented with timers and counters sufficient to count pulses of the clock signal under test for a frequency measurement or a duty cycle measurement. The measurement may be performed with timing provided by the selected reference clock signal. Measurement circuit 212 may be configured to produce a measurement m of the frequency, denoted $f_m$, or of the duty cycle, denoted $d_m$.

The measurement may be passed to a series of comparator circuits 216. Comparator circuits 216 may be implemented by any suitable number and combination of circuits. Comparator circuits 216 may be configured to determine whether the measurement exceeds any identified thresholds 214. Any suitable number and kind of thresholds 214 may be used. Thresholds 214 may be stored in, for example, memory, tables, registers, or may be hard-coded. Thresholds 214 may be defined in pulse counts, frequency, duty cycle, absolute terms, or percentage of error terms. Thresholds 214 may be individually defined for each of clock sources 106. Thresholds 214 may include high thresholds and low thresholds. Thresholds 214 may be configurable and adjustable.

In one embodiment, the number and varying degrees of threshold 214 may be defined by users or designers of system 100. Different thresholds may be specified, beyond which different alerts and corrective actions may be taken. The number of different thresholds, the value of the thresholds, and the associated corrective action for each threshold may be configurable. For example, a first threshold $l_1$ may be specified, below which a frequency or duty cycle is determined to be in error. Furthermore, a second threshold $l_1$ may be specified, below which a frequency or duty cycle is determined to have failed. Below the first threshold but above the second threshold may represent an operating state for which additional diagnostics are to be performed, wherein a component is starting to wear, or another, non-critical condition is occurring. However, below the second threshold, operation of system 100 may be impeded or a dangerous condition may arise. Thus, below the first threshold $l_1$ but above the second threshold $l_2$, a clock warning may be issued by control logic 202. Below the second threshold $l_2$, a clock failure may be issued by control logic 202. Similarly, upper thresholds $h_1$ and $h_2$ may be included in thresholds 214. A frequency or duty cycle over $h_1$ but below $h_2$ may represent a non-critical, erroneous operating condition wherein the clock is operating too fast, such as in an over-clocking scenario. Control logic 202 may issue a clock warning. A frequency or duty cycle over $h_2$ may represent a critical, erroneous operating condition wherein the clock is operating too fast. Control logic 202 may issue a clock failure.

Furthermore, as discussed above, upon an initial determination of an erroneous condition, control logic 202 may be configured to repeat a test of the clock but with a different reference. Control logic 202 may test the original reference itself. Control logic 202 may repeat such tests until the true faulty signal is isolated and identified. Control logic 202 may withhold the corrective action until the true faulty signal is identified.

Figure 3A:
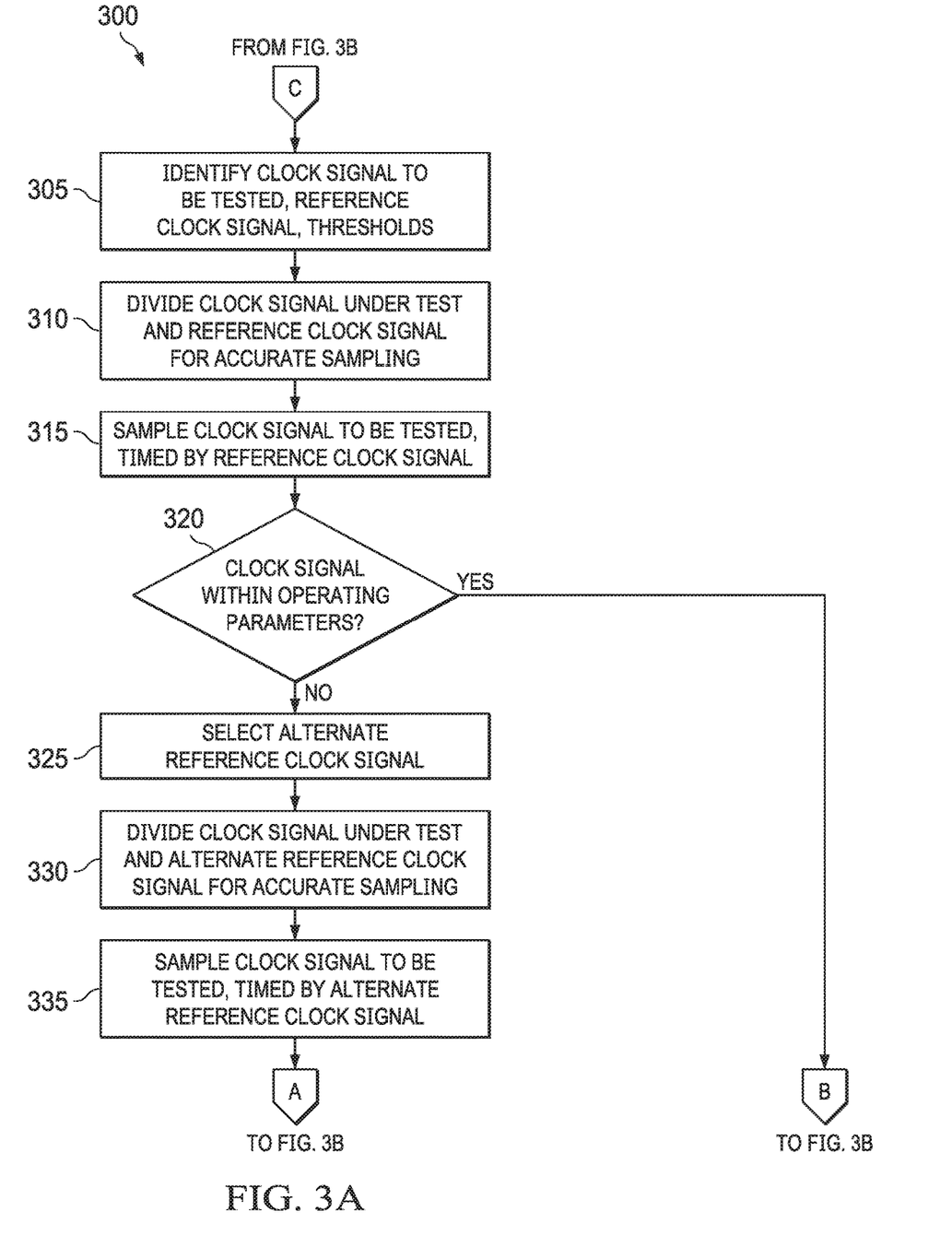
FIGS. 3A and 3B are illustrations of an example method for performing clock monitoring, according to embodiments of the present disclosure.
Figure 3B:
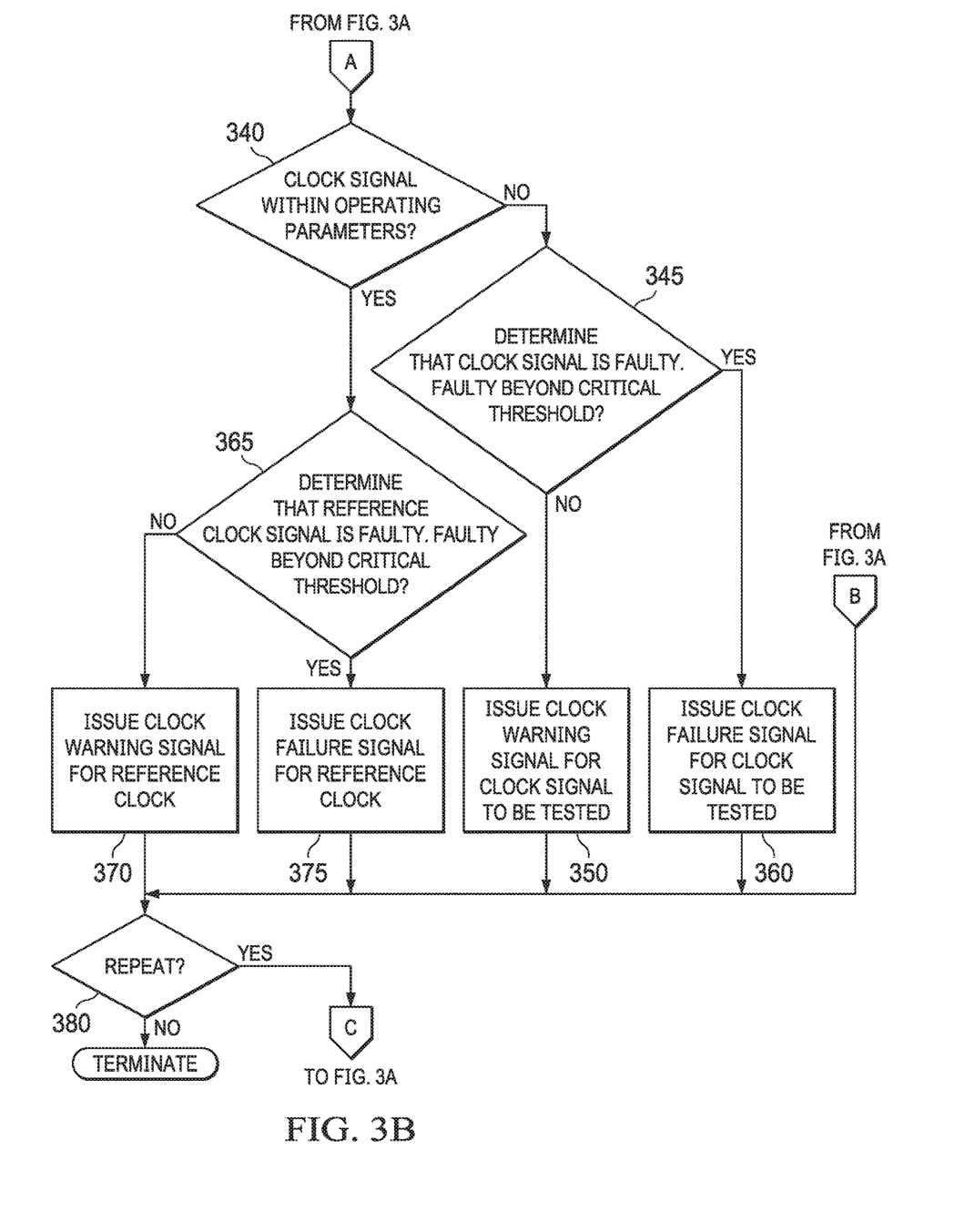

FIGS. 3A and 3B are illustrations of an example method 300 for performing clock monitoring, according to embodiments of the present disclosure. Method 300 may be implemented wholly or in part by any suitable elements of system 100, such as by FSCM 104, processor 112, or control logic 202. Method 300 may include more or fewer steps than shown in FIGS. 3A and 3B. Method 300 may begin at any suitable step, such as 305. Various steps of method 300 and instances of method 300 may be repeated, conducted in parallel, executed recursively, or omitted.

At 305, a clock signal to be tested, a reference clock signal to be used in the test of the clock signal, threshold for the test, and other parameters such as a duration of a test may be identified.

At 310, the clock signal under test and the reference clock signal may be divided in order to perform accurate sampling of the clock signal under test.

At 315, the clock signal to be tested may be sampled. The sampling may be timed or synchronized by the reference clock signal.

At 320, it may be determined whether the clock signal to be tested is operating within specified thresholds and parameters with regards to frequency or duty cycle. If so, method 300 may proceed to 380. Otherwise, method 300 may proceed to 325.

At 325, it may be determined whether the clock signal under test is faulty or whether the reference clock used to time the test are faulty. An alternate reference clock signal may be selected for a follow-up test of the clock signal to be tested. The alternate reference clock signal may be a third, separate clock signal. In other cases, the alternate reference clock signal may be used to test the original reference clock signal.

At 330, the clock signal under test and the alternate reference clock signal may be divided in order to perform accurate sampling of the clock signal under test.

At 335, the clock signal to be tested may be sampled. The sampling may be timed or synchronized by the alternate reference clock signal.

At 340, it may be determined whether the clock signal to be tested is operating within specified thresholds and parameters with regards to frequency or duty cycle. If so, the original reference clock may be faulty, rather than the clock signal to be tested. Method 300 may proceed to 365. Otherwise, method 300 may proceed to 345.

At 345, it may be determined that the clock signal to be tested is faulty. It may be determined which set of thresholds that the clock signal violated. If the clock signal to be tested is faulty beyond a critical threshold, then method 300 may proceed to 360. If the clock signal is faulty, but not beyond a critical threshold, then method 300 may proceed to 350.

At 350, a clock warning signal may be issued for the clock signal to be tested. The warning may contain information about the faulty clock and the degree to which the clock is faulty. Corrective action, such as notifying a user, may be performed. Method 300 may proceed to 380.

At 360, a clock failure signal may be issued for the clock signal to be tested. The failure signal may contain information about the failed clock. Corrective action, such as switching a source of the clock signal to a backup clock, may be performed. Method 300 may proceed to 380.

At 365, it may be determined that the original reference clock signal is faulty. It may be determined which set of thresholds that the reference clock signal violated. If the reference clock signal is faulty beyond a critical threshold, then method 300 may proceed to 375. If the reference clock signal is faulty, but not beyond a critical threshold, then method 300 may proceed to 370.

At 350, a clock warning signal may be issued for the reference clock signal. The warning may contain information about the faulty reference clock and the degree to which the reference clock is faulty. Corrective action, such as notifying a user, may be performed. Method 300 may proceed to 380.

At 360, a clock failure signal may be issued for the reference clock signal. The failure signal may contain information about the failed reference clock. Corrective action, such as switching a source of the reference clock signal to a backup clock, may be performed. Method 300 may proceed to 380.

At 380, it may be determined whether or not to repeat or test another clock. If so, method 300 may proceed to 305. If not, method 300 may terminate.

Thus, embodiments of the present disclosure may monitor for situations such as a microcontroller or components thereof operating at an out-of-specification clock frequency. Such operations may be erratic, reduce component life-time, or lead to device failure. Serial communications such as Ethernet, USB, UART, I2C, etc. may have errors with such an incorrect frequency. Control applications such as power supply and motor control with incorrect clock frequencies can cause application damage or danger to users. These problems and others may be solved or mitigated by system 100.

The present disclosure has been described in terms of one or more embodiments, and it should be appreciated that many equivalents, alternatives, variations, and modifications, aside from those expressly stated, are possible and within the scope of the disclosure. While the present disclosure is susceptible to various modifications and alternative forms, specific example embodiments thereof have been shown in the drawings and are herein described in detail. It should be understood, however, that the description herein of specific example embodiments is not intended to limit the disclosure to the particular forms disclosed herein.

We claim:

1. A clock monitor, comprising:
   a first clock input, configured as a test clock input;
   a second clock input, configured as a reference clock input;
   a third clock input;
   a measurement circuit configured to generate a first measurement of a frequency or a duty cycle of the test clock input using the reference clock input;
   a comparator circuit configured to compare the first measurement to one or more thresholds; and
   control logic configured to:
      determine whether the first measurement was below a lower limit or above an upper limit of one or more thresholds;
      based on a determination that the first measurement was below a lower limit or above an upper limit of one or more thresholds, cause the measurement circuit to generate a second measurement of a frequency or a duty cycle using the third clock input in combination with the test clock input or the reference clock input;
      determine whether the second measurement was below a lower limit or above an upper limit of one or more thresholds;
      based on whether the second measurement was below a lower limit or above an upper limit of one or more thresholds, determine that the test clock input or the reference clock input are faulty.

2. The clock monitor of claim 1, wherein the control logic is further configured to select a backup clock to replace a clock source of the test clock input or the reference clock input based on the second measurement.

3. The clock monitor of claim 1, wherein the control logic is further configured to delay selection of a backup clock to replace a clock source of the test clock input or the reference clock input based on the first measurement.

4. The clock monitor of claim 1, where the thresholds include:
   a first threshold, beyond which the control logic is configured to issue a warning signal while maintaining a clock source of the test clock input or the reference clock input; and
   a second threshold, beyond which the control logic is configured to issue a failure while selecting a backup clock to replace the clock source of the test clock input or the reference clock input.

5. The clock monitor of claim 4, wherein the warning signal includes an interrupt event for a processor and the failure includes a clock switch event configured to replace the clock source.

6. The clock monitor of claim 1, further comprising a backup clock select input to determine a backup clock from a plurality of clock candidates to replace a clock source of the test clock input or the reference clock input based on the second measurement.

7. The clock monitor of claim 1, wherein the control logic is further configured to adjust a period of time during which data is collected for measured clock inputs.

8. The clock monitor of claim 1, wherein the control logic is further configured to adjust accuracy for which data is collected for measured clock inputs.

9. The clock monitor of claim 1, wherein the control logic is further configured to cause the measurement circuit to generate the second measurement of a frequency or a duty cycle of the test clock input using the third clock input as a reference clock signal.

10. The clock monitor of claim 1, wherein the control logic is further configured to cause the measurement circuit to generate the second measurement of a frequency or a duty cycle of reference clock input using the third clock input as a reference clock.

11. The clock monitor of claim 1, wherein the control logic is further configured to select the test clock input and the reference clock input from three or more candidate clock signals.

12. A method, comprising:
receiving a first clock input as a test clock input;
receiving a second clock input as reference clock input;
receiving a third clock input;
generating a first measurement of a frequency or a duty cycle of the test clock input using the reference clock input;
comparing the first measurement to one or more thresholds;
determining whether the first measurement was below a lower limit or above an upper limit of one or more thresholds;
based on a determination that the first measurement was below a lower limit or above an upper limit of one or more thresholds, generating a second measurement of a frequency or a duty cycle using the third clock input in combination with the test clock input or the reference clock input;
determining whether the second measurement was below a lower limit or above an upper limit of one or more thresholds; and
based on whether the second measurement was below a lower limit or above an upper limit of one or more thresholds, determining that the test clock input or the reference clock input are faulty.

13. The method of claim 12, further comprising selecting a backup clock to replace a clock source of the test clock input or the reference clock input based on the second measurement.

14. The method of claim 12, further comprising delaying selection of a backup clock to replace a clock source of the test clock input or the reference clock input based on the first measurement.

15. The method of claim 12, where the thresholds include:
a first threshold, beyond which the method includes issuing a warning signal while maintaining a clock source of the test clock input or the reference clock input; and
a second threshold, beyond which the method includes issuing a failure while selecting a backup clock to replace the clock source of the test clock input or the reference clock input.

16. The method of claim 15, wherein the warning signal includes an interrupt event for a processor and the failure includes a clock switch event to replace the clock source.

17. The method of claim 12, further comprising receiving a backup clock select input to determine a backup clock from a plurality of clock candidates to replace a clock source of the test clock input or the reference clock input based on the second measurement.

18. The method of claim 12, further comprising generating the second measurement of a frequency or a duty cycle of the test clock input using the third clock input as a reference clock signal.

19. The method of claim 12, further comprising generating the second measurement of a frequency or a duty cycle of reference clock input using the third clock input as a reference clock.

20. The method of claim 12, further comprising selecting the test clock input and the reference clock input from three or more candidate clock signals.

* * * * *